United States Patent [19]

Hoenninger, III

[11] Patent Number: 5,739,691

[45] Date of Patent: Apr. 14, 1998

[54] MULTI-FREQUENCY DIGITAL LOW PASS FILTER FOR MAGNETIC RESONANCE IMAGING

[75] Inventor: John C. Hoenninger, III, Oakland, Calif.

[73] Assignee: The Regents of the University of California, Oakland, Calif.

[21] Appl. No.: 563,239

[22] Filed: Nov. 28, 1995

[51] Int. Cl.$^6$ ................................................. G01V 3/00
[52] U.S. Cl. ................................................. 324/322; 324/307
[58] Field of Search ................................ 324/307, 300, 324/318, 322; 128/653.2–653.5; 364/413.13

[56] References Cited

U.S. PATENT DOCUMENTS

| Re. 33,259 | 7/1990 | Crooks et al. . | |
|---|---|---|---|
| 3,423,529 | 1/1969 | O'Neill . | |
| 3,443,229 | 5/1969 | Becker . | |
| 3,522,537 | 8/1970 | Boughtwood . | |
| 4,594,607 | 6/1986 | Lewis, Jr. et al. . | |
| 4,673,880 | 6/1987 | Compton et al. . | |
| 4,709,270 | 11/1987 | Mehrgardt . | |
| 4,740,753 | 4/1988 | Glover et al. . | |
| 4,785,463 | 11/1988 | Janc et al. . | |
| 4,839,573 | 6/1989 | Wise . | |
| 4,879,514 | 11/1989 | Mehlkopf et al. . | |
| 4,893,316 | 1/1990 | Janc et al. . | |
| 4,949,040 | 8/1990 | Proksa . | |
| 4,950,991 | 8/1990 | Zur . | |
| 4,958,311 | 9/1990 | Kadowaki et al. . | |
| 4,992,736 | 2/1991 | Stormont et al. | 324/309 |
| 5,001,429 | 3/1991 | Constable et al. . | |
| 5,170,122 | 12/1992 | Bernstein . | |
| 5,170,123 | 12/1992 | Holland . | |
| 5,345,173 | 9/1994 | Bito et al. . | |
| 5,349,296 | 9/1994 | Cikotte et al. . | |
| 5,427,102 | 6/1995 | Shimode et al. | 128/653.2 |
| 5,529,068 | 6/1996 | Hoenninger, III et al. | 324/309 |

FOREIGN PATENT DOCUMENTS

| 0 412 747 | 2/1991 | European Pat. Off. . |
|---|---|---|
| 0411840 | 2/1991 | European Pat. Off. . |
| 0429191 | 5/1991 | European Pat. Off. . |
| 2 290 875 | 1/1996 | United Kingdom . |
| WO 93/07679 | 4/1993 | WIPO . |
| WO 95/20352 | 8/1995 | WIPO . |

OTHER PUBLICATIONS

Crooks et al., "Performance of Analog–to–Digital Converters and a Floating Point Digital Signal Processor in a Digital Receiver for MRI," Poster, IEEE Nuclear Science Symposium (Nov. 3–6, 1993, San Francisco).

Harris Corporation Data Sheet, "HSP43216, Halfband Filter," File No. 3365.1, Aug. 1993.

Redfield et al., Simple NMR Input System Using a Digital Signal Processor, Journal of Magnetic Resonance, Series A 108, 234–237 (1994).

Halamek et al., "The Elimination of Baseline Distortions Induced by Audio Filters," Journal of Magnetic Resonance, Series A110, 194–197 (1994).

(List continued on next page.)

*Primary Examiner*—Louis M. Arana
*Attorney, Agent, or Firm*—Nixon & Vanderhye P.C.

[57] ABSTRACT

A digital lowpass filter design for filtering nuclear magnetic resonance (NMR) signals in a magnetic resonance imaging (MRI) system supports multiple frequencies and is highly configurable without sacrificing speed and performance. The first FIR filter stage of a synchronized multirate digital filter is selected from a database of filter coefficient/parameter sets which are loaded at start time and used in place. Second (and later) FIR filter stages are fixed in the example. A large number of different filter frequencies can be selected rapidly without changing the parameterized filter program reducing the amount of time to start up the MRI system and allowing "on-the-fly" filter changes in real-time between echoes and/ or A/D samples. For example, filter preselection by the host can be performed in less than 100 μs, and, one of several lowpass filters can be selected by the sequencer "on-the-fly" with a latency of less than 10 μs.

26 Claims, 12 Drawing Sheets

OTHER PUBLICATIONS

M. E. Rosen, "Selective Detection in NMR by Time–Domain Digital Filtering," Journal of Magnetic Resonance, Series A 107, 119–125 (1994).

Cross, "Improved Digital Filtering Technique for Solvent Suppression," Journal of Magnetic Resonance, Series A 101, 220–224 (1993).

Harris Corporation Data Sheet, "HSP43220, Decimating Digital Filter," File 2486.2, pp. 3–3 to 3–22, May 1991.

Varosi, et al., "Multiplexing Applied to a Digital MR Receiver," *Proceedings of the Society of Magnetic Resonance*, vol. 2, p. 1009 Aug. 19–25, 1995.

Crochiere et al, *Multirate Digital Signal Processing* (Prentice–Hall 1983), pp. 1–42, 193–218.

Crooks et al, "Noise Aliasing At the Input of Analog–to–Digital Converters in MR Systems", Abstract, SMRI 11th Annual Meeting (Mar. 27–31, 1993, San Francisco).

Crooks et al, "Performance of a Digital Receiver with a Floating Point Digital Signal Processor", Abstract, SMRI 11th Annual Meeting (Mar. 27–31, 1993, San Francisco).

Crooks et al, "Performance of Some Analog–to–Digital Converters Used in MR Systems", Abstract, SMRI 11th Annual Meeting (Mar. 27–31, 1993, San Francisco).

Holland, "An Overview of Digital Spectrometers for MR Imaging", 2 *Journal of Magnetic Resonance Imaging* 241–46 (Mar./Apr. 1992).

Holland et al, "The Design of a Digital RF Transmitter/Receiver (DTR) for Magnetic Resonance Imaging" (1990 Picker International Inc.).

Holland et al, "The Design and Comparative Evaluation of a Digital Transmitter/Receiver (DTR) for MR Imaging", *Proceedings of the 1989 SMRM*, p. 182.

Holland et al, "Simultaneous Imaging with Multiple Coils Using Digital Transmit and Receive Circuits", Proceedings of the 1989 SMRM, p. 1143.

Rader, "A Simple Method For Sampling In–Phase and Quadrature Components," IEEE Transactions on Aerospace and Electronic Systems, vol. AES–20, No. 6, pp. 821–824 (Nov. 1984).

Proska, "A Fully Digital Spectrometer for Low Field MR Imaging Systems," Proceedings of the 1988 SMRM, at 266.

Hewlett–Packard Co. Data Sheet, "HP 35665A Dynamic Signal Analyzer Concepts Guide," HP Part No. 35665–90028, Washington, Sep. 1991, pp. 7–1 to 7–5, 12–4 to 12–7.

Holland, G.N., et al., "The Design and Comparative Evaluation of a Digital Transmitter/Receiver (DTR) for MR Imaging," *Book of Abstracts*, vol. 1, Society of Magnetic Resonance in Medicine, Eighth Annual Meeting and Exhibition Aug. 12–18, 1989, Amsterdam, The Netherlands, p. 182.

FIG. 2 DIGITAL RF RECEIVER

DSP Memory

DSP Memory

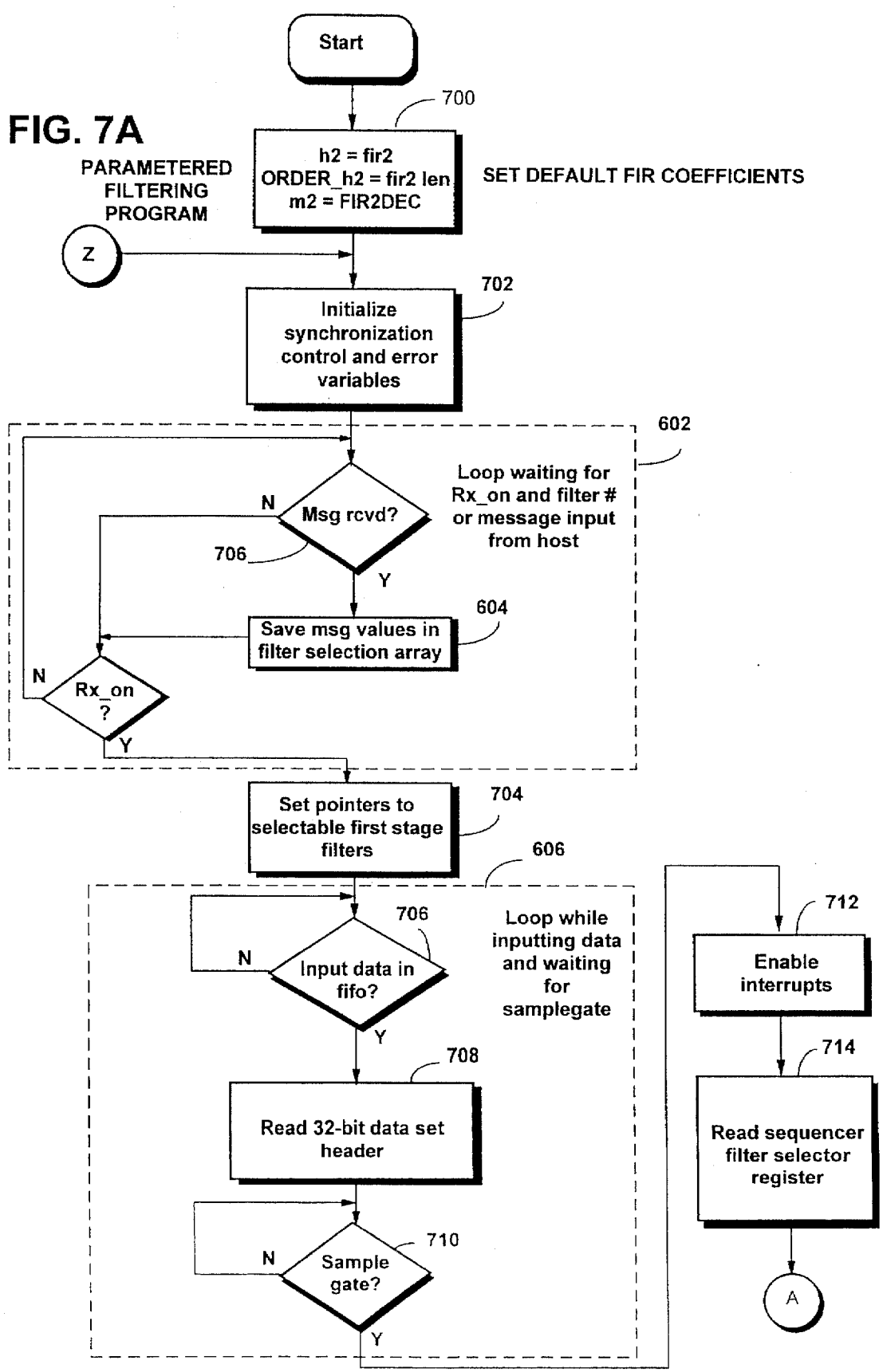
FIG. 7A PARAMETERED FILTERING PROGRAM

MULTI-FREQUENCY DIGITAL LOW PASS FILTER FOR MAGNETIC RESONANCE IMAGING

FIELD OF THE INVENTION

This invention relates to nuclear magnetic resonance (NMR) imaging, and more particularly to digital RF receiving techniques for use in magnetic resonance imaging (MRI) systems. Still more specifically, the present invention relates to techniques for rapidly configuring a digital low pass filter in a magnetic resonance imaging digital RF receiver.

BACKGROUND AND SUMMARY OF THE INVENTION

Nuclear magnetic resonance ("NMR") phenomena cause the human body (or other object of interest) to generate "NMR" signals for pick-up by a magnetic resonance imaging ("MRI") system. The magnetic resonance imaging system has a radio frequency ("RF") receiver that receives, amplifies and filters these NMR signals (projections). The RF receiver's output is processed by a computer to generate a displayed image of the body's internal structure.

To generate high quality images, it is important for the MRI RF receiver to accurately receive and process the weak NMR signals generated by the body. Signal filtering is one of the more important functions performed by the MRI RF receiver. Filters within the RF receiver must provide tight frequency selectivity and other high performance. Filtering is needed to extract the MRI signal from surrounding noise and signals-and is also needed before analog-to-digital conversion to provide "anti-aliasing." "Aliasing" occurs when the Nyquist rate (half the analog-to-digital converter sampling rate) is less than the frequency of signal components presented to the converter input. Aliasing causes unwanted parts of the signal spectrum to "fold over" into the digitized sample stream representing the desired signal pass band.

In the past, MRI RF receivers typically used expensive, high performance analog low pass filters to perform these filtering operations prior to analog-to-digital conversion of the incoming signal stream. Some such analog low pass filters for MRI use sometimes had changeable RC networks that could be electronically switched or reconfigured using FET type switching transistors. In such reconfigurable analog filter arrangements, the characteristics (e.g., cut-off frequency) of the filter could be changed by electronically switching components in and out of the RC network. While such reconfigurable analog filters provided some additional flexibility, they also suffered from certain performance deficiencies, such as, for example, frequency-dependent phase shifts, poor transient response, non-zero DC offset, drift, and imperfect gain and phase matching between pairs of filters used for "quadrature" channels. In addition, switching components in and out of the filter circuit introduced long settling times, caused transients, and exacerbated problems with DC offsets. Thus, it was generally difficult to accurately change the analog filtering characteristics "on-the-fly" during signal processing using such prior designs.

"Digital receivers" have now begun to replace analog receivers in MRI systems. Copending commonly-assigned U.S. patent applications Ser. No. 08/260,789 filed 16 Jun. 1994 now U.S. Pat. No 5,529,068 (attorney docket no. 89-192) and Ser. No. 08/503,045 filed Jul. 17, 1995 (attorney docket no. 89-191) disclose examples of digital receivers for MRI use. As digital signal processors (DSPs) and other high performance digital hardware have become available, cost-effective and increasingly more capable, it has become possible to filter the received NMR signal in the digital domain instead of in the analog domain in order to increase receiver performance in certain respects. For example, it is possible to construct, using modern digital signal processing components, a digital low pass filter which exhibits a very sharp cut-off and a linear phase response throughout its passband. Digital filtering provides additional significant advantages including, for example, programmability, potential increases in dynamic range, and potential improvement in signal-to-noise ratio ("S/N"). Similarly, digital receivers implemented using modern digital signal processing components provide several additional well known advantages such as elimination of DC and low frequency noise, perfect matching of I and Q quadrature channels, and finer quantization. Digital signal processing techniques can thus significantly improve noise and distortion performance (and hence image quality), and can provide additional advantages such as increased stability and flexibility.

As mentioned above, digital receivers have an advantage of being "programmable," i.e., their filtering characteristics can be changed by simply changing software. Thus, it is possible to change to a digital filter with different filtering characteristics by loading different software code into the digital signal processor (DSP) performing the digital filtering operation. The high degree of reconfigurability provided by software-based digital filtering techniques provides great flexibility over prior reconfigurable analog type filters as described above while also avoiding the long settling time and DC offset problems (and potentially also the transient problems) suffered by such analog filters.

One approach to specifying the characteristics of a MRI digital filter is to select and specify those characteristics at the time a filtering program is linked and loaded into the DSP program memory. Using this approach, for example, a control program executing on a host computer that supports the digital receiver selects (e.g., based on human operator interaction and selection) the configuration, coefficients and other parameters of a digital FIR low pass filter program to be used to filter the received NMR signal. This control program then controls the calculation/look up of appropriate FIR low pass filter coefficients, and inserts them as part of the program to be executed by the filtering DSP. Parameters such as the decimation factors of each filter stage of a multi-stage filter and the number of output points are also inserted into the DSP program at this time. The resulting compiled and linked executable is then loaded into the program memory of the filtering DSP, and execution is started. Since there are many possible filter bandwidths, it is not practical to create and store all of the many executables required ahead of time.

Unfortunately, the process of calculating and building the coefficients and parameters and integrating them with a digital filter DSP executable is time consuming. This is because of the relatively large number of filter coefficients that must be specified for a high-performance FIR filter. For example, a typical high performance digital filter stage for MRI use may have 512 distinct coefficients for a filter with asymmetric coefficients (or half that for a linear phase filter with symmetric coefficients). It takes a relatively long time for even a fast host computer to process such coefficients and download them with the associated filtering program into the digital filter DSP. The delay incurred by this method directly increases the total patient imaging time.

It is desirable in MRI systems to reduce as much as possible the delay between the time the human operator decides which MRI protocol to use and the time data acquisition actually begins. Many activities (e.g., generating the sequencer database, tuning the MRI system, etc.) must be performed during this time. Meanwhile, the waiting patient may be anxious and uncomfortable. Reducing the delay time will benefit patients (who will not have to wait as long), and also increases the throughput of the MRI system (allowing more images to be captured and generated within a given time period).

The present invention provides a new digital low pass FIR filter for MRI use that supports rapid selection and reconfiguration of filter characteristics. The digital filter can be configured with parameters supplied to it by a host processor without changing the filter program. Hundreds of different FIR low pass filter cut off frequencies can be selected from rapidly by the host computer along with different numbers of output data points. More than one filter may be specified by the host so that multiple low pass filters may be selected in real-time, "on-the-fly" as data acquisition proceeds.

Some of the advantageous features provided by the new digital MRI filter in accordance with the present invention include:

parameterized first filter stage of a multi-rate digital filter parameterized overall filter configuration (e.g, one, two or three stages)

second (and later) filter stages have fixed configurations with only the first stage filtering characteristics changing the "cost" of storing many different sets of first stage parameters is low, so all parameters can be loaded initially (e.g., at "boot" time) and active ones subsequently selected "on-the-fly"

effective, efficient and rapid host communications delay between filter selection and digital receiver start is reduced MRI system can change filter characteristics between successive projections for better imaging optimization digital receiver can be started at system initialization time and allowed to run continuously without any need to reload filtering executable code.

One example implementation of a digital multi-rate FIR filter has a variable bandwidth first stage and up to two succeeding stages with fixed bandwidth and other characteristics. Each of the filter stages provides decimation (reduction in sampling rate) during the filtering without extra overhead. Decimation by the first stage is variable, and decimation by the final one or more stages is fixed at a factor of two. Synchronization is built into the filter stages so that the output data point associated with a specific "tagged" input data point is always identified. Depending on the low pass filter frequency and input sampling rate, the number of stages can be varied for optimum throughput and filter characteristics. The latter one or more filter stages may use an "inverted convolution" implementation which minimizes the amount of time after the input data set acquisition is completed for the output data set to be fully computed (see application Ser. No. 08/260,789).

In one example, the host computer selects a low pass filter by sending a message specifying a filter ID and number of output points. The host obtains the filter ID from a lookup table which specifies the low pass filter frequencies supported and the associated ID. The number of output points depends upon the data acquisition process required by the MRI protocol and the particular host application. If more than one low pass filter is required during a real-time data acquisition, the host may specify the parameters for each. The specific low pass filter to use for a specific projection may then be selected "on-the-fly" in real-time by an output bit field of the MRI sequencer used to control other real-time events such as, for example, RF receiver and RF transmitter operation. The time to switch from one low pass filter to another in the example can be very short (e.g., the time required to change fewer than ten program parameters-less than five microseconds with current digital signal processors).

As discussed above, one example provides a parameterized synchronous multi-rate FIR filter that can use up to three filter stages with only the first one needing variable bandwidth and decimation factor. The sets of filter coefficients for the first FIR filter stage are stored in a database (e.g., with up to 512 coefficient entries for each filter). If the FIR filters are symmetric, the coefficient storage requirements may be reduced by half since the coefficients are duplicated in each half of the filter in that case. Because an array of coefficients is only required for the first FIR stage, large numbers of filters may be stored in a relatively small amount of memory. The first stage coefficients may be stored in "fast" DSP memory (e.g., a 64K SRAM) and selected with data pointers so they need never be copied to another memory location during image data acquisition. The filter coefficients for the second and third stages may be fixed and, in one example, identical. The number of filter stages used for a given filter may depend on the input sampling rate and the low pass filter cutoff frequency, with the number of stages and the length of the first FIR filter stage being determined if desired empirically after a large number of digital FIR low pass filter simulations.

This implementation example eliminates the problem of excessive time to recalculate the first FIR filter for each protocol by storing all of the possible FIR coefficients for first stage filters in a database within the program or data memory of the DSP used to perform the filtering operation. The filter program can be designed to switch from one first stage filter to another by changing a single pointer, and to require look up of less than ten parameters from the filter database for each different FIR low pass filter configuration.

In one particular example with a 2K word program and a 64K program SRAM, one hundred and twenty FIR filters with parameters can be loaded with the program when the MRI system is initialized. When a MRI protocol is selected, the host computer control program sends a short message to the digital receiver through a communications interface to preselect the particular subset of FIR filters (e.g, up to sixteen) contained in the filter database which is to be used during the protocol. The time required to do this is on the order of less than one second. A further selection of one of the subset of FIR filters preselected by the host message may be generated and communicated to the digital receiver "on-the-fly" (e.g., by the real-time MRI sequencer) to select (and change to) a particular filter for all or part of the protocol.

The currently selected filter may be changed "on-the-fly" between NMR projections. As a result of this new approach, the digital receiver can be started and left running at all times, and a tool can be written which allows the digital receiver to be configured and loaded independently of the host computer MRI sequence selector and the tune and acquisition operations. Different filter characteristics may be used at different points of a protocol in order to optimize filtering. For example, it becomes possible to reduce filter bandwidth and increase signal-to-noise ratio for different readout gradients and associated different data acquisition times in order to optimize performance and sensitivity.

BRIEF DESCRIPTION OF THE DRAWINGS

These and other features and advantages provided by the present invention will be better and more completely understood by referring to the following description of an example embodying the invention in conjunction with the drawings, of which:

FIGS. 7A–7E show a more detailed example of digital filtering DSP program control steps.

DETAILED DESCRIPTION OF AN EXAMPLE EMBODIMENT(S)

Figure 1:
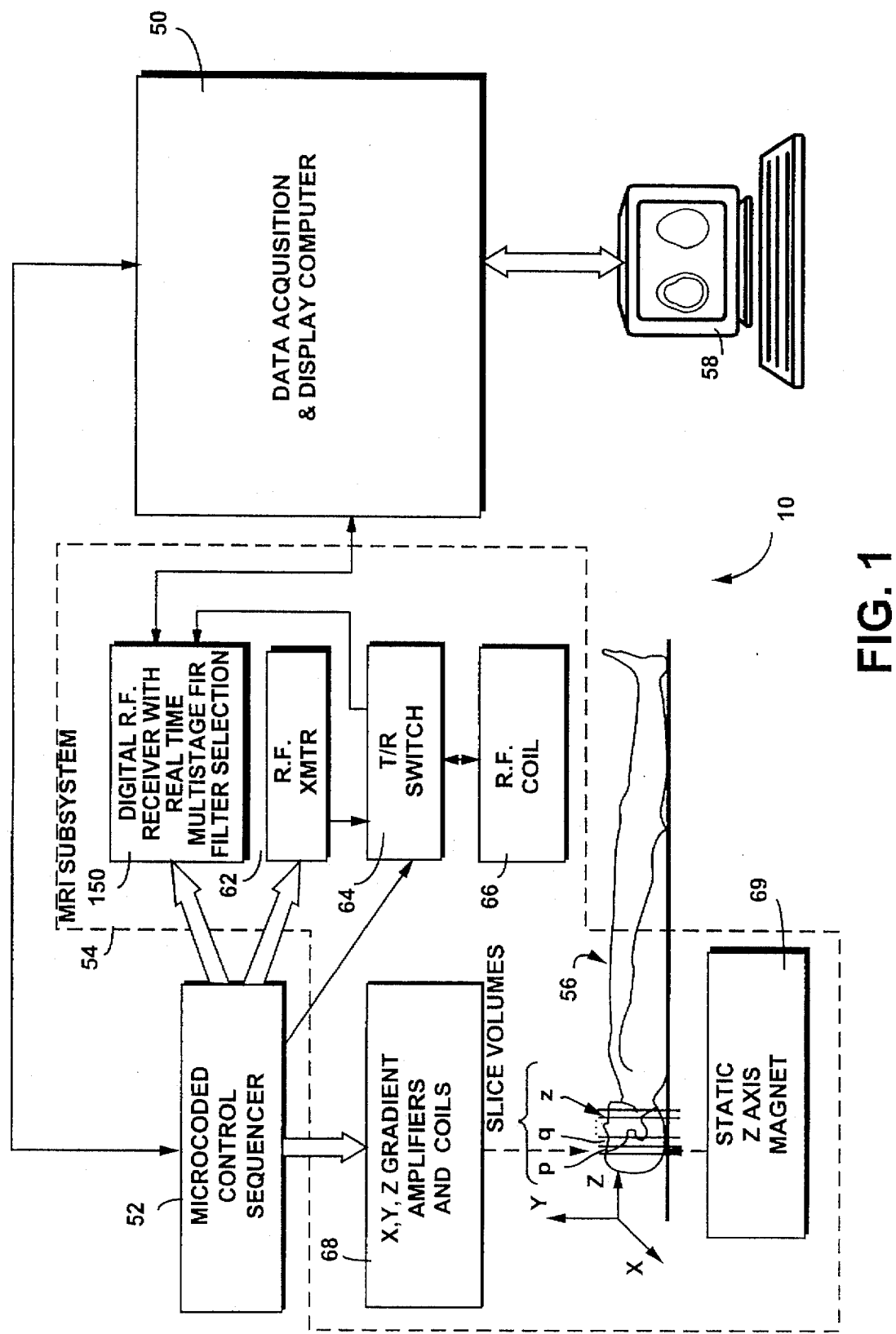
FIG. 1 shows an example of a MRI system.

FIG. 1 shows an example of a magnetic resonance imaging "MRI") system 10 including a digital receiver 150. System 10 also includes a host computer 50, a MRI real-time control sequencer 52, and a MRI subsystem 54. Subsystem 54 is controlled in real time by sequencer 52 to generate magnetic and radio frequency fields that stimulate nuclear magnetic resonance ("NMR") phenomena in an object 56 (e.g., a human body) to be imaged. A resulting image of body 56 on display 58 may show features and structures that cannot be seen using X-ray, ultrasound or other medical imaging techniques.

The basic techniques for magnetic resonance imaging are very well known and accordingly need not be explained here in detail. Very simply, MRI subsystem 54 includes a large static magnet 69 which applies a magnetic field to the object 56 (this field may be modified by "gradient" fields produced by gradient coils 68). This magnetic field aligns the spin axes of rotating nuclei (e.g., hydrogen atom protons) within the object 56. An RF transmitter 62 generates a radio frequency (RF) pulse of a particular radio frequency (called the "Larmor frequency"). This RF pulse is connected by a "transmit/receive" ("T/R") switch 64 to an RF coil 66 which applies a corresponding RF (electro) magnetic field to the body 56. The RF field temporarily stimulates the nuclei in object 56, causing the axes of their spins to be realigned. When the RF field is switched off, "relaxation phenomena" cause the nuclei to return to their non or less stimulated states. As the nuclei return to such non or less stimulated states, they generate their own RF magnetic field (the "NMR" signal).

The NMR signal "echo" induces a voltage into RF coil 66. An electronic RF digital receiver 150 (which is connected by the "T/R" switch 64 to the RF coil 66 between RF pulse transmissions) receives, amplifies, filters and detects the induced voltage to provide a pair of time-varying output signals. The digital receiver 150 includes an analog-to-digital conversion arrangement that converts these output signals into digital signals (e.g., 2's complement representation). The digital receiver 150 samples the signal at fixed time intervals and outputs the sampled results as numerical digital data to the data acquisition and display computer 50. Sets or matrices of this numerical data so obtained are stored and analyzed by computer 50, which "reconstructs" (using complicated but conventional mathematical procedures) amplitude information corresponding to the concentration of nuclei within different volumes of the object. Such reconstructed amplitude information is used to generate a high quality image of the internal structure of the object 56, which can be displayed on a display screen 58, printed onto film for later viewing, etc.

Figure 2:
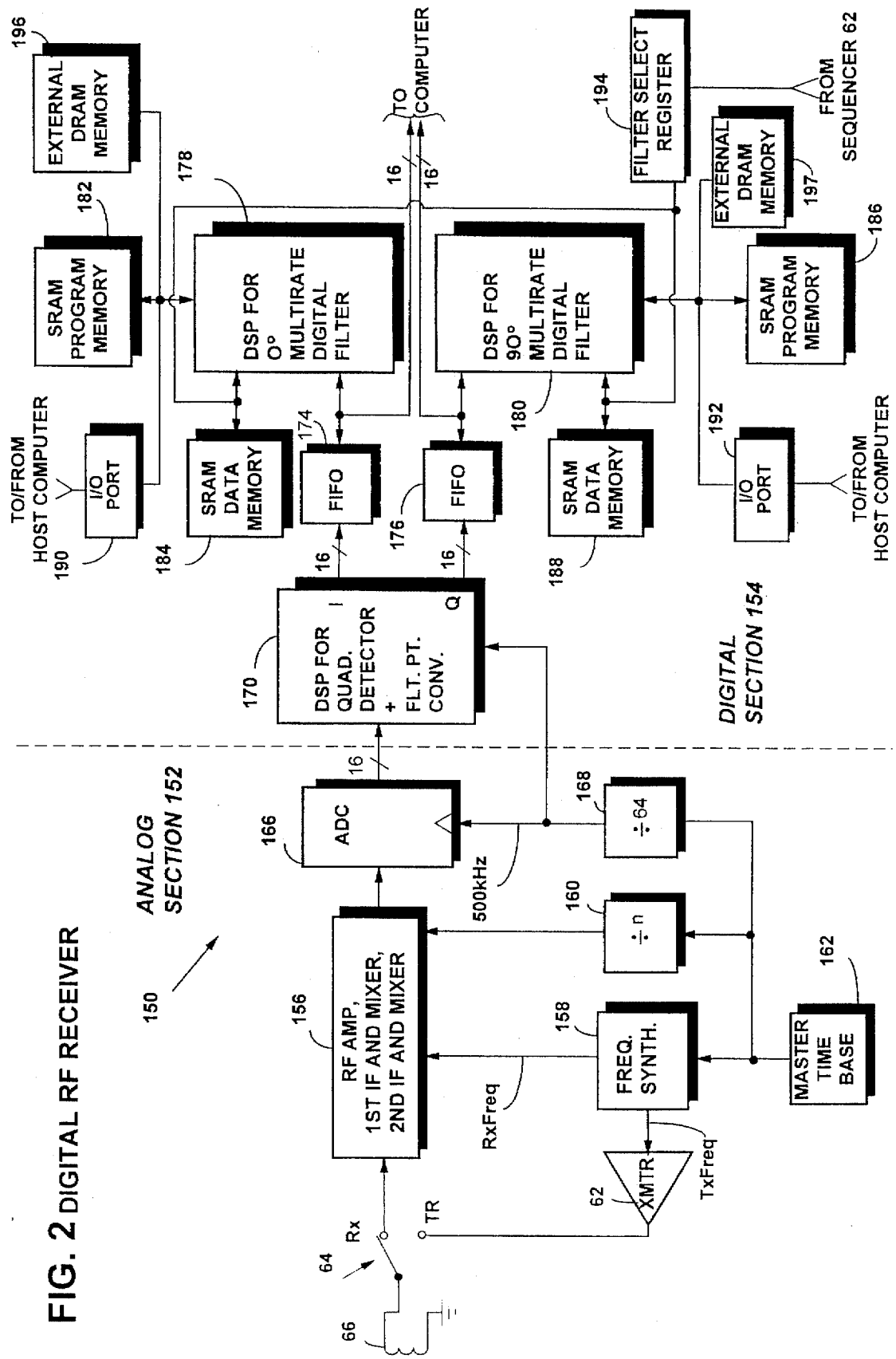
FIG. 2 shows a block diagram example of a digital RF receiver.

FIG. 2 shows an example of digital RF receiver 150 including an analog section 152 and a digital section 154. The analog or "front end" section 152 is connected to RF coil 66 through T/R switch 64. During receive operation, T/R switch 64 couples RF coil 66 to analog signal processing circuitry 156 including for example a conventional RF amplifier, first intermediate frequency (IF) stage (including an anti-aliasing bandpass analog filter) and associated mixer, and second IF stage (including an analog bandpass filter for anti-aliasing and out-of-band signal rejection and associated mixer. In this example, local oscillator signals (e.g., "Rx Freq") applied to the first and second mixers are derived by a frequencer synthesizer 158 and an appropriate frequency divider 160, respectively, from a master time base 162. Frequency synthesizer 158 also provides a transmit frequency ("Tx Freq") to RF transmitter 62. The RF transmitter 62 is activated for RF pulse generation, the RF pulse being coupled to the same or different RF coil 66 via T/R switch 64.

During receive operation, the output of the analog circuitry 156 is applied to the input of analog-to-digital converter (ADC) 166 for conversion into 16-bit parallel digital format. ADC 166 samples the received RF signal in this example at a 500 KHz rate with the sampling clock being synchronous with the master time base 162 (a divider 168 is used to provide appropriate frequency division). The output of ADC 166 is provided to a DSP 170 and appropriate support circuitry for quadrature detection and floating point conversion.

DSP 170 produces two demodulated channels (I and Q) in quadrature. In this example, these I and Q channels are outputted into separate FIFO (first-in-first-out) buffers 174, 176, respectively for digital filtering by respective I and Q channel DSPs 178, 180. In the example, DSPs 178, 180 accept data input from quadrature detector 170 via FIFOs 174, 176, respectively. DSPs 78, 180 digitally filter the input data set, and, upon completion of the filtering operations, output the digitally filtered results to host computer 50 via the same FIFOs 174, 176, respectively, for further processing and imaging.

DSP 178 has an associated program memory 182, a data memory 184 and external DRAM memory 196. Similarly, DSP 180 has a program memory 186, an associated data memory 188 and external DRAM 197. Program memories 182, 186 (which may each comprise a 32K or 64K word SRAM) store filtering program code and associated parameters for execution by DSPs 178, 180 respectively. Data memories 184, 188 (which may also each comprise a 32K word SRAM, for example) store intermediate "sum of product" convolution results and, in the example, are used to implement a "ring buffer" to allow orderly rapid iteration of convolution transformations. External DRAM memories 196, 197 may store a database of first FIR stage filter coefficients.

In the example, host computer 50 may communicate with DSP 178 and/or program memory 182 and DRAM memory 196 via an I/O port 190, and similarly may communicate with DSP 180 and/or program memory 186 and DRAM memory 197 via an I/O port 192. I/O ports 190, 192 permit, for example, host computer 50 to download a linked executable memory image into each of program memories 182, 186 for execution respectively by DSPs 178, 180.

In the example, digital receiver 150 also includes a filter select register 194 that receives a filter select word from control sequencer 62. In this example, the filter select register 194 may provide a 4-bit value that is mapped into the data memory address space of DSPs 178, 180. As will be explained below, in this example, the filter select register 194 selects one of a subset of n first stage FIR filters preselected by a host computer 50 message for current use in the filtering operations being carried out by DSPs 178, 180.

Figure 3:
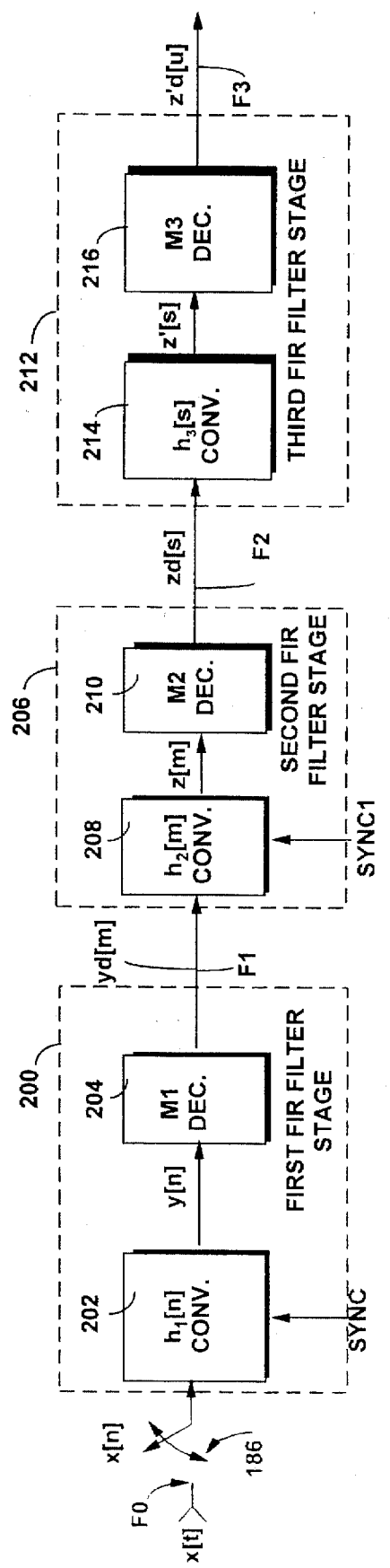
FIG. 3 shows an example of a multi-rate digital filtering operation.

FIG. 3 shows an example of a multi-rate, multi-stage digital filtering operation performed by each of DSPs 178, 180 in this example. After sampling at an F0 sampling rate and quadrature detection, the sampled input data set x[n] in each of the I and Q channels independently is processed by a first digital filter stage 200 comprising a convolution transformation 202 and a decimation 204. Convolution 202 provides a convolved data set y[n] resulting from x[n] convolved with $h_1$[n]. For this and all other filters described here, the number of coefficients in h[n] is even, so the filters are even ordered. In this example, the convolved data set y[n] is decimated by a decimation factor M1 to provide a first digital filter stage output data set yd[m] having a sampling rate F1. In this example, note that the F1 rate of index "m" at the first filter stage 200 output is lower than the F0 rate of x[n] at the input of that stage because of decimation factor M1 provided by decimation block 204.

The data set yd[m] is filtered by a second FIR digital filter stage 206 comprising a convolution transformation 208 and a decimation 210 to provide a second filter stage output data set zd[s]. This output data set zd[s] with sampling rate F2 is the second digital filter stage output. If desired, in the example, the data set zd[s] may be further digitally filtered by a third FIR filter stage 212 comprising a further convolution transformation 214 and a further decimation 216 to provide an output data set z'd[u] at a sampling rate F3. The F2 rate of the zd[s] output of second filter stage 206 is lower than the F1 rate by the M2 decimation factor applied by the second stage, and if the third stage 212 is present, the final digital filter output z'd[u] at sampling rate F3 is lower than the F2 sampling rate by the M3 decimation factor applied by the third filter stage. In this example, the characteristics of the second filter stage 206 and third filter stage 212 are fixed, and the characteristics of the third stage 212 (if used) are the same as the characteristics of the second stage 206. In this example, the second (and third) stage filtering characteristics may be as follows:

M2=M3=2

$h_2=h_3$

ORDER of second stage 206=ORDER of third stage 212=124

In this example, host computer 50 can select whether third filter stage 212 is to be used, and in addition, has great flexibility in selecting the characteristics and parameters for first filter stage 200. More specifically, referring to FIG. 4, host computer 50 loads into digital receiver 150, a database of different filter characteristics. This database 300 is loaded by computer 50 into each of digital receiver program memories 182, 186 or external DRAM memories 196, 197 at the time MRI system 10 is activated. Database 300 may include N different filter records 302 each including a filter identification (ID) field 304, a field 306 specifying the number of first stage filter coefficients (i.e., the ORDER of the first filter stage), a decimation factor field 308 specifying the M1 filter decimation factor, a field 312 specifying each of the (e.g., 256 or 512) filter coefficients defining the $h_1$ convolution transformation 202, and an additional field 314 specifying additional filter parameters (field 314 may, for example, specify whether or not a second stage 206 or third filter stage 212 is to be used).

In an alternate implementation, the digital filter program and all FIR filter coefficients may be permanently stored in EEPROM or flash PROM memory so that the digital receiver configures itself on power up. This may be desirable in some manufacturing and test situations. Manual filter selection can be supported with a small keypad along with diagnostics and self tests. The keypad may be connected only when required (e.g., via a special flat cable) in order to reduce costs. In this alternate implementation, additional FIR filters may be added to a "standard" prestored repertoire of filters by reserving a RAM buffer in DSP program memory for such additional filters. The host may then calculate the FIR first stage coefficients and parameters and load them into the memory buffer. The host may then send a message to the digital receiver that controls the receiver to select a new FIR filter. The DSP filter program, being parameterized, will support the new FIR filter.

The digital filtering program executable that host computer 50 loads into DSP program memories 182, 186 in the example is "parameterized" in the sense that it can provide many different filter characteristics based upon parameters supplied by a selected one of database entries 302 for example. The digital filtering executable selects one of these entries 302 in this example based on two different inputs:

(1) a host message 400 communicated by computer 50 to digital receiver 150 prior to the beginning of a MRI protocol, this host message preselecting a subset of database entries 302; and (2) the contents of a filter select word 500 specified in this example by sequencer 52, the filter select word selecting one of the filters preselected by host message 400.

Figure 4:
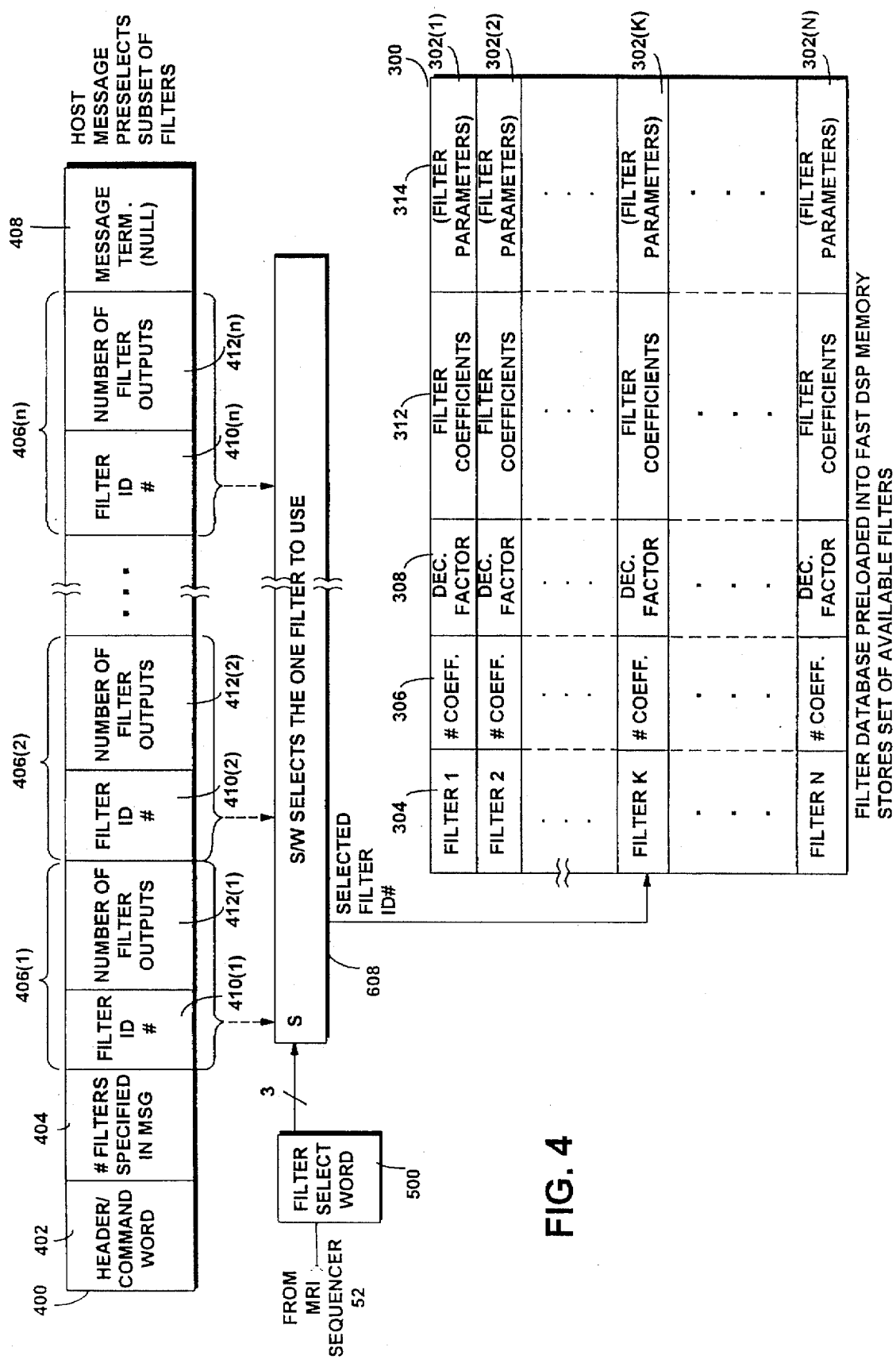
FIG. 4 shows an example of data structures used for digital filtering.

In more detail, example host message 400 shown in FIG. 4 includes a command word 402, a field 404 indicating the number of filters specified in the message, a sequence of fields 406(1), 06(2)..., 405(n) each specifying one of the filter entries 302 within database 300, and a message termination (null) character 408. In this example, fields 406 each include a filter ID number field 410 and a further field 412 specifying the number of last stage filter outputs. Each filter ID number field 410 corresponds to one of entries 302 within filter database 300. FIG. 4 also shows schematically how the filter select word 500 supplied by the sequencer 52 controls software selection of the one filter ID specified by host message 400, which selected filter ID is used to "look up" the appropriate more detailed parameters from filter database 300.

Figure 5:
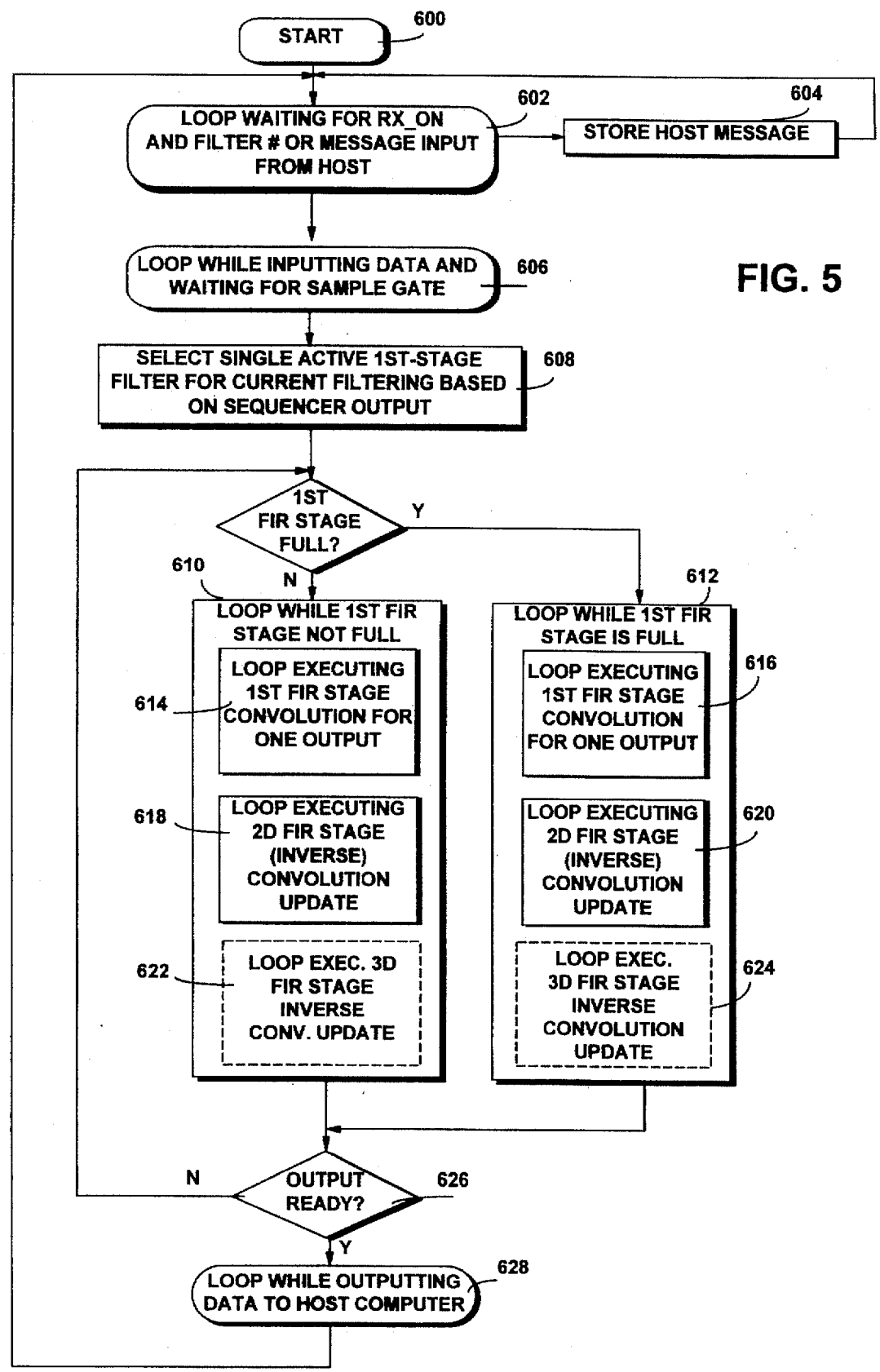
FIG. 5 shows an example of digital filtering DSP program control steps.

FIG. 5 shows an example of a parameterized filtering program performed independently by DSPs 178, 180 based at least in part on parameter information shown in FIG. 4. After appropriate initialization, DSP 178 (180) loops on each input data set x[] using the FIR filter first stage specified by host message 400 and an additional input from sequencer 52. When digital receiver 150 is started, it loops waiting for the receiver on ("$Rx_{13}$ ON") and filter number or message 400 input from host computer 50 (block 602). After host computer 50 sends a host filter specification message 400, digital receiver 150 receives the message and stores it (e.g., in program memory 182, 186 or other appropriate storage location) so that it is readily available (block 604). If FIR coefficient data base 300 is stored in external DRAM 196 (197), the appropriate filter data is copied into an array storage in SRAM 182 (186). DSP 178 (180) then loops without inputting data from FIFO 174 (176) waiting for sequencer 52 to assert the "$Rx_{13}$ ON" signal. When data input starts, DSP 178 (180) then loops while inputting data waiting for sequencer 52 to assert the "Sample Gate" signal that defines an active receiver time window (block 606). At least by the time sequencer 52 in this example asserts Sample Gate, it also asserts filter select word 500 (shown in FIG. 4) that is used by digital receiver 150 to select one of the subset of filter configurations preselected by host message 400 (block 608). Thus, in this example, the sequencer-asserted filter select word 500 is used to select the one of filter ID number fields 410 and associated "number of filter outputs" fields 412 within the received host message 400 that are to be used. At this point, DSP 178 (180) generates, based on the selected filter ID number field 410, a pointer to look up the corresponding entries 302 within filter database 300 or corresponding array storage. The "looked up" database entry 302 in combination with the selected "number of outputs" field 412 contents fully specifies the parameters of the filtering operation to be performed by the executing DSP filtering program, including:

number of filter outputs from the last stage first stage filter decimation factor M1 first stage filter coefficients (together defining $h_1$)

whether or not a second or third stage filter 212 is to be used. Since the decimation factors and coefficients of second filter stage 206 (and third filter stage 212) are fixed in this example, these values need not be specified by either host message 400 or sequencer 52.

Referring again to FIG. 5, once the current filter parameters have been selected, DSP 178 (180) is ready for active filtering of an input signal. In this example, for optimization purposes, different loops 610, 612 are respectively used for filtering when the first FIR stage is not full and when the first FIR stage is full. Each of these loops in this example includes a first loop (614, 616) executing the first FIR stage convolution for one output; a second loop (618, 620) executing a second FIR stage standard (or inverse if last stage) convolution update; and, if a third filter stage is being used, a third loop (622, 624) executing a third FIR stage inverse convolution update. Loops 610, 612 continue to execute until completed (decision block 626) at which time a further loop (628) outputs data to the host computer 50 before returning control back to the top of the program flow shown (block 602) to await the next digital receiver event.

Figure 6A:
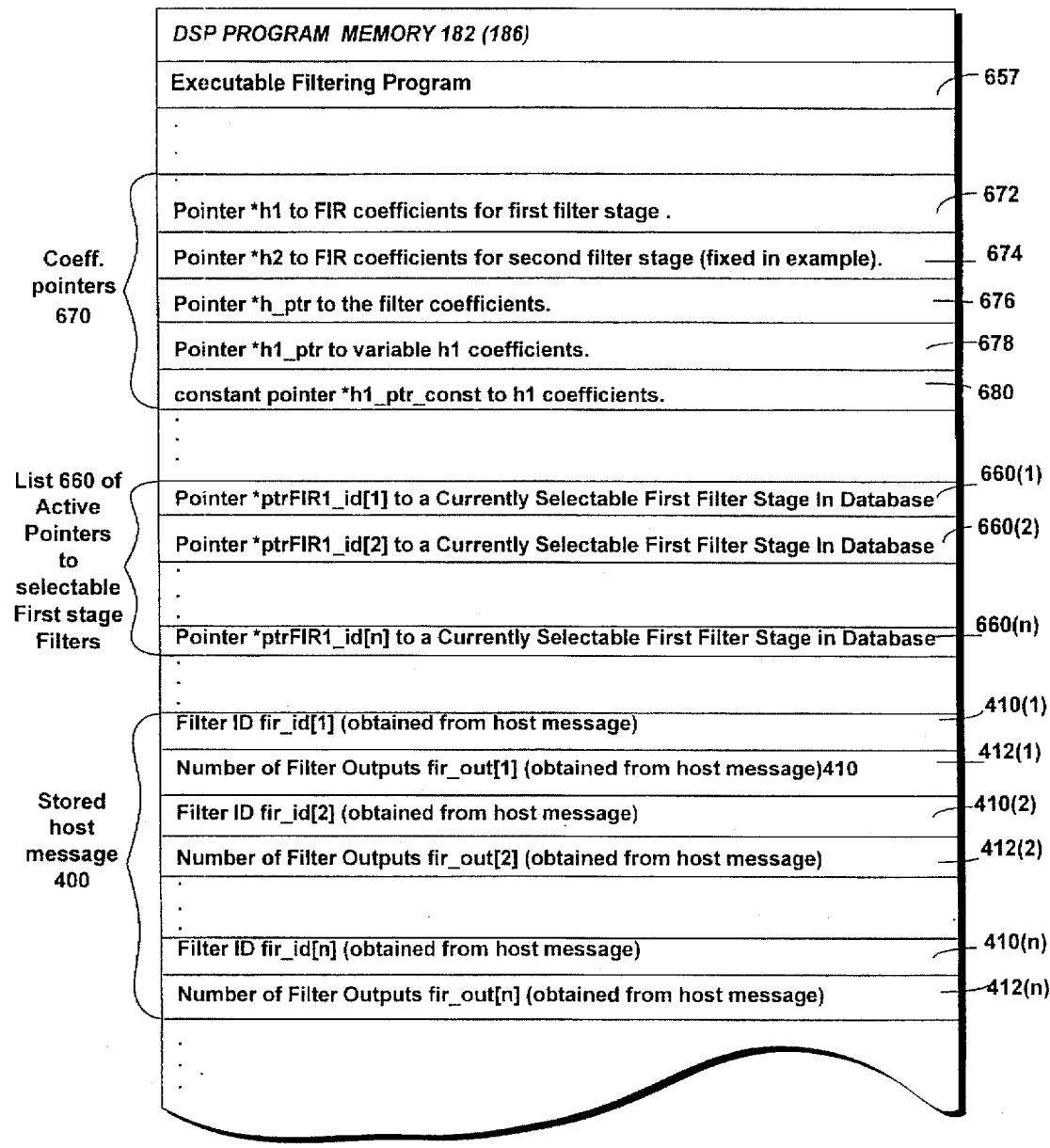
FIGS. 6A and 6B show more detailed examples of digital filtering data structures.
Figure 6B:
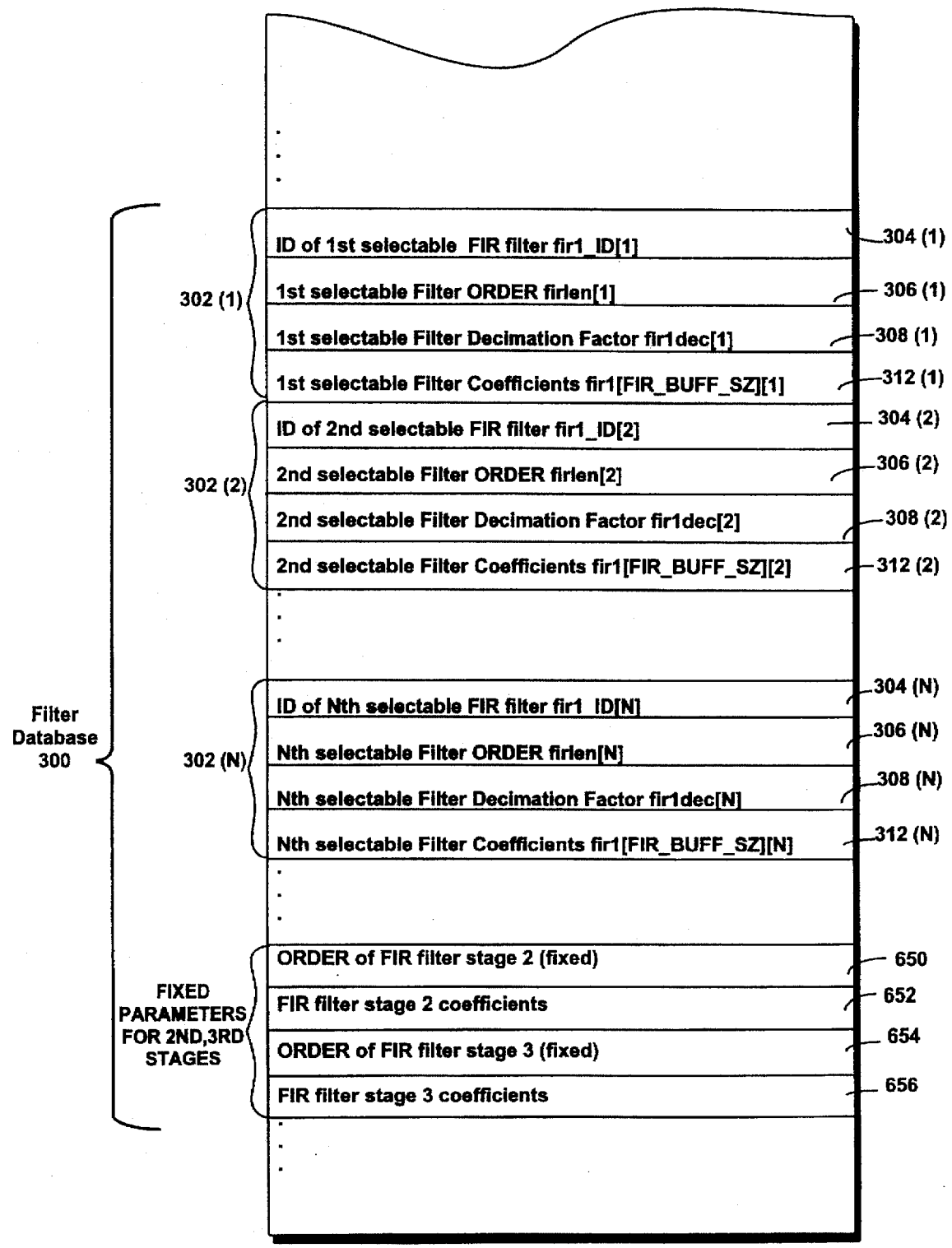
Figure 7B:
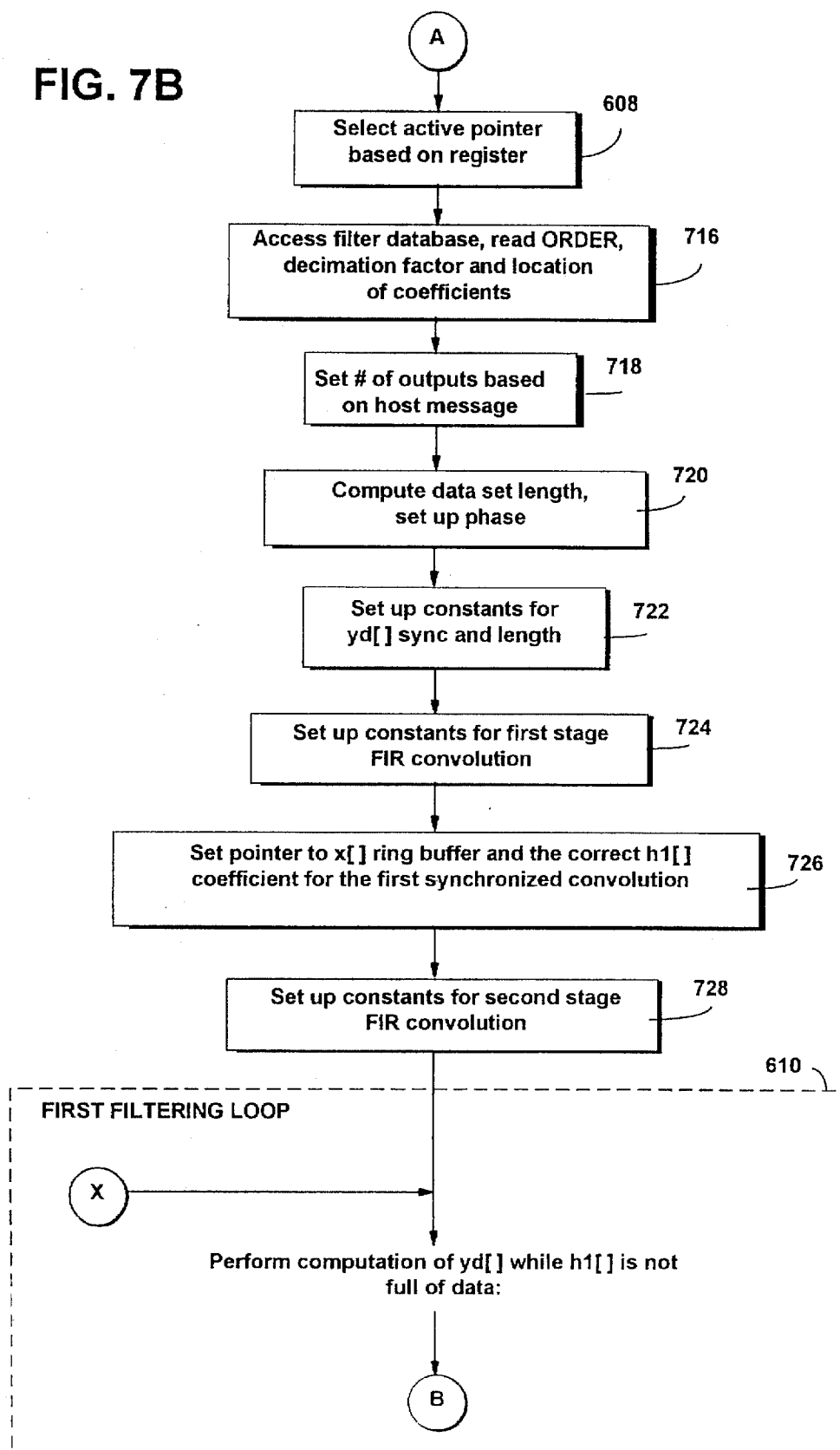
Figure 7C:
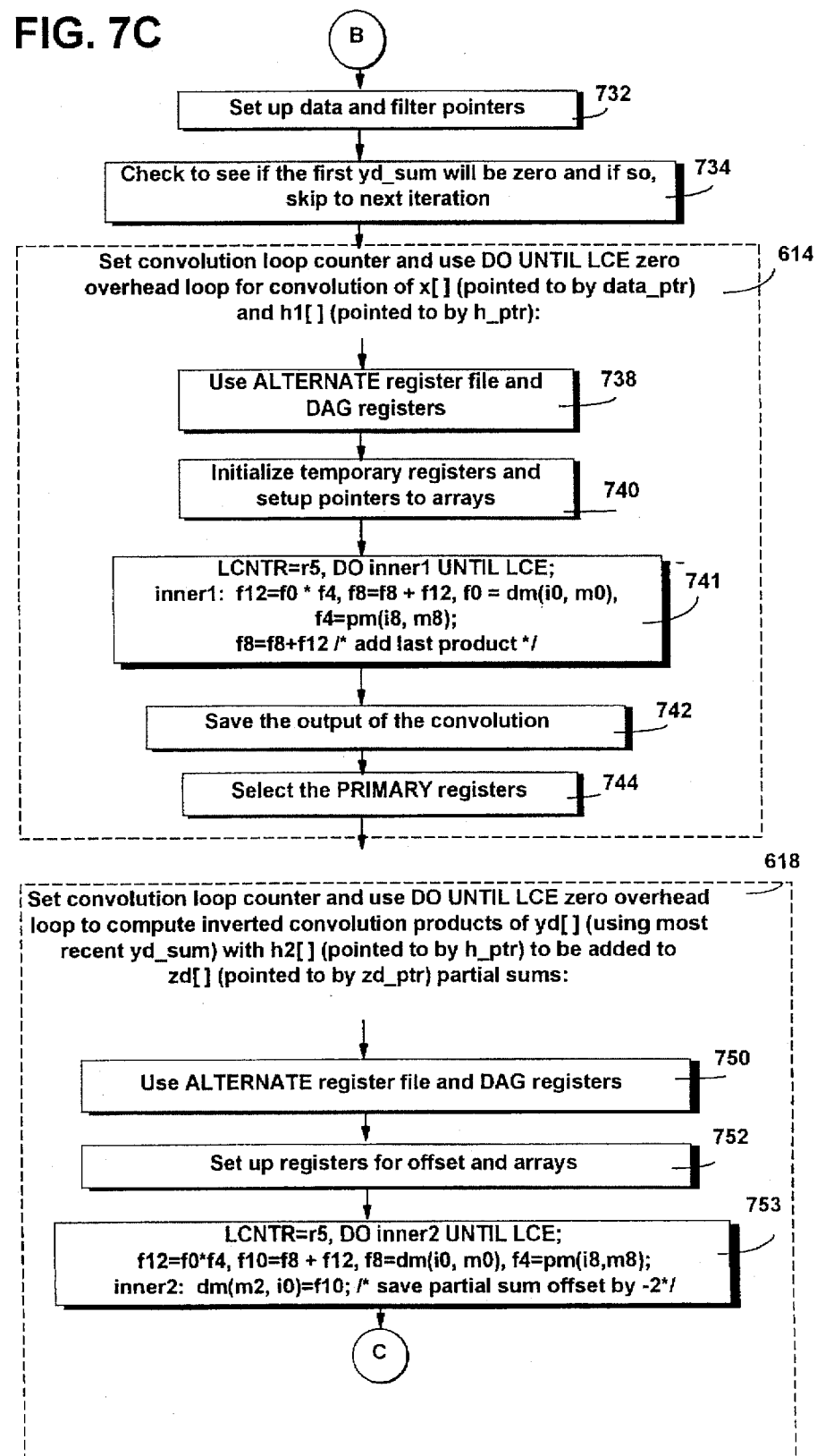
Figure 7D:
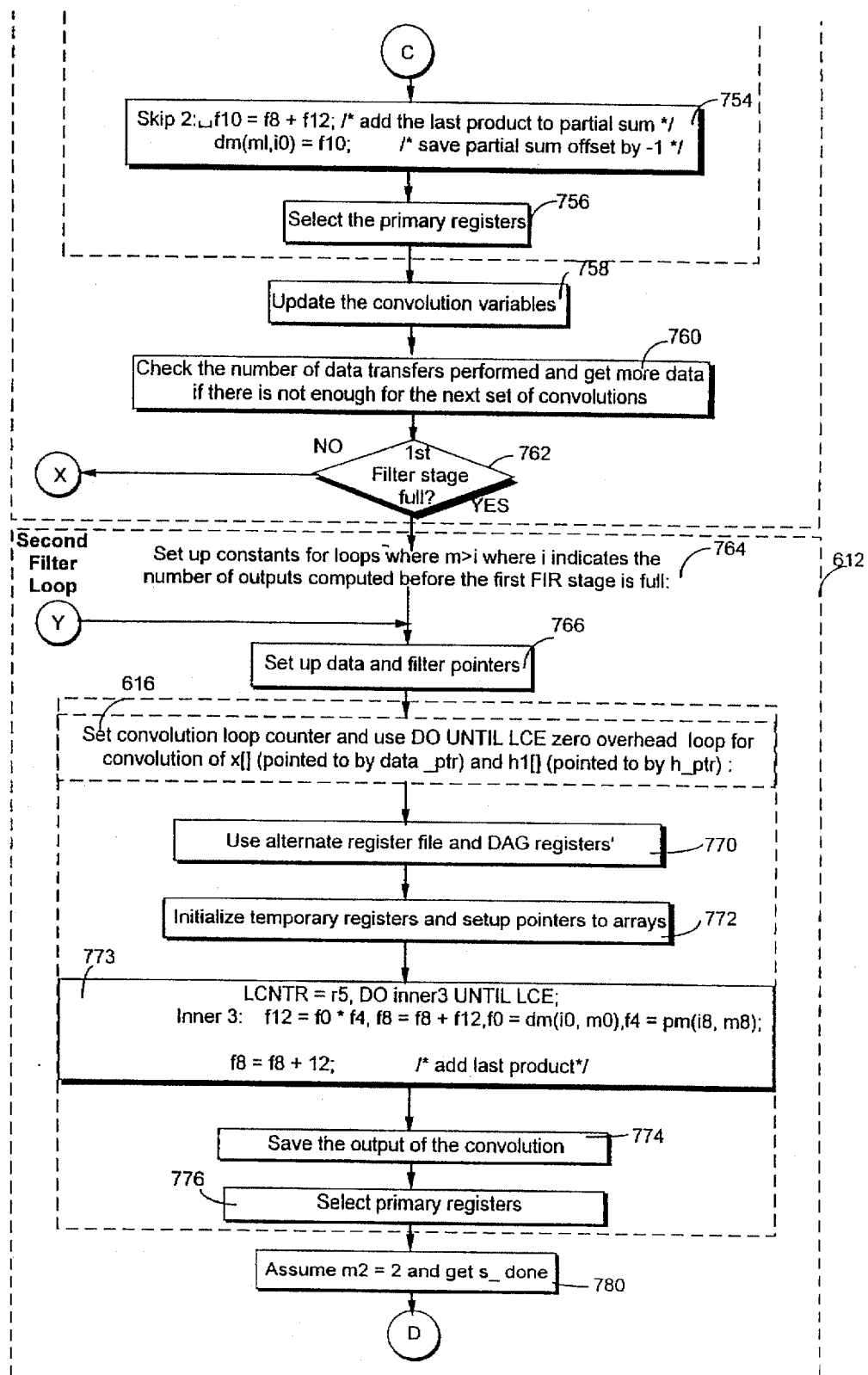
Figure 7E:
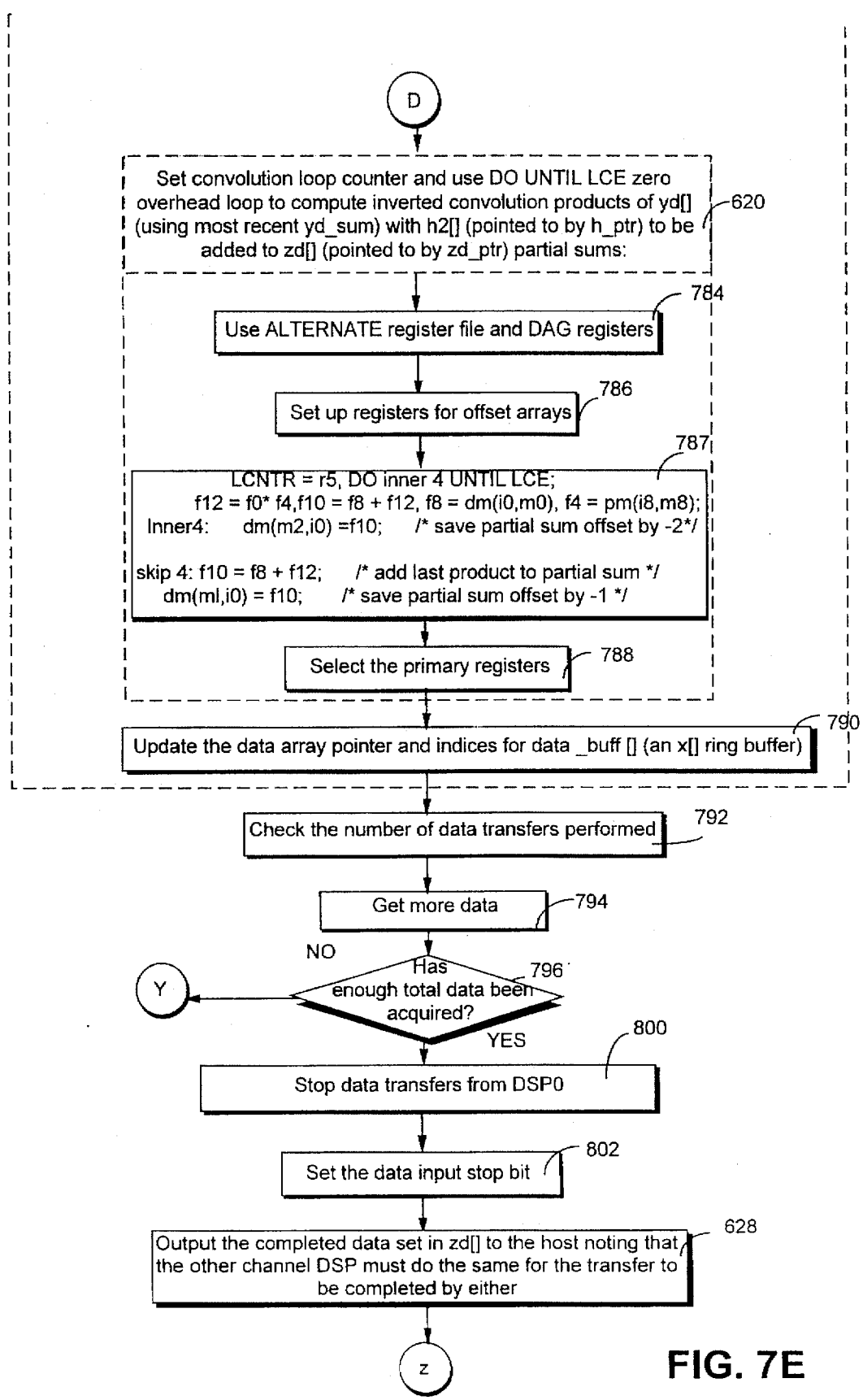

FIGS. 6A and 6B show a more detailed example of data structures stored in DSP program memories 182, 186 used by a DSP digital filtering process. FIG. 6B shows an example of filter database 300 having entries 302 each including an ID field 304, an ORDER (number of coefficients) field 306, a decimation factor 308 and a buffer storing values of the number of coefficients specified by field 306. In this particular example, no filter parameter 314 is shown, but such parameter field may be provided as described above to select between a 2-stage and a 3-stage filter. As shown in FIG. 6B, the filter database information may be stored in an array indexed from L to N, with filter coefficients being stored as sub-arrays within the array. In the example, the filter database 300 contains, for example, up to 120 entries (i.e., N=120), and may be generated by computer 50 at link time along with executable code 657 which is then loaded together with the database 300 into program memories 182, 186. The executable 657 may also be loaded separately from database 300. The filter database 300 (including the filter coefficients) may thus be created and linked in with the DSP program by a host application program executing on computer 50 to create a single memory image which is then downloaded into DSP memory 182 (186) when system 10 is initialized. Once the filter database 300 is loaded, it is not necessary in the example to reload it during normal system operation. Database 300 in the example may be stored in whole or in part in fast (zero wait state) SRAM program memory 182 (186) and thus coefficients and other parameters do not have to be copied to another location in memory in order to be used at full speed once the $Rx_{13}ON$ signal has been asserted by sequencer 52.

As shown in FIG. 6A, filter database 300 may also include fixed parameters controlling the characteristics of the second and third FIR filter stages, namely:

a field 650 specifying the ORDER of the second FIR filter stage;

a buffer 652 containing the second filter stage coefficients;

a field 654 specifying the ORDER of the third FIR filter stage; and a buffer 656 storing the coefficients of the third FIR filter stage. In this example, the information stored in fields/buffers 650, 652, 654, 656 are "fixed" in the sense that they do not change in response to host message 400 and/or filter select word 500. These values are also specified by host computer 50 at link time, and accordingly, may take on whatever values the host computer specifies.

In this example, DSP 178 (180) stores received host message in an array 400 within program memory 182 (186), and maintains certain additional pointers to help it efficiently access the information stored in filter database 300 based in part on the information contained in stored host message 400. For example, as shown in FIG. 6A, DSP 178 (180) sets up a list (array) 660 of "active pointers" to records 302 within database 300 or a subset of it that have been preselected by stored host message 400. Thus, in the example, list 660 comprises a list of entries 660(1), 660(2), ..., 660(n) corresponding to stored host message elements 410(1), 410(2), ..., 410(n). List 660 is made up of "pointers" that "point" to respective ones of the records 302 within filter database 300 that have been selected by host message 400. This list 660 may, in the example, have up to sixteen entries such that it can be selected by a 3-bit filter control word "nibble" 500 supplied by sequencer 52. Thus, list 660 permits up to sixteen filter selectors to be supported for selection of low pass filters "on-the-fly" by MRI sequencer 52. List 660 allows DSP 178 (180) to rapidly access the appropriate information from filter database 300 upon specification or change of filter select word 500 by sequencer 52 before Sample Gate is asserted and FIR filtering is started.

As shown in FIG. 6A, DSP 178 (180) also maintains certain additional coefficient pointer information in a block 670. Such pointers may include, for example:

a pointer 672 to the FIR coefficients for the first filter stage (this pointer normally points to the filter coefficient buffer 312 within currently selected filter database 300 entry 302);

a pointer 674 to FIR coefficients for the second (and third) stage filter (in the example, this pointer points to coefficient buffer 652); and additional pointers 676, 678, 680 that are used to index specific filter coefficients during the convolution processes.

FIGS. 7A–7E show a more detailed example of program control steps performed by DSP 178 (180) to implement MRI digital receiver synchronized multi-rate FIR digital filtering. In this example, the DSP begins by setting certain default pointers for the second (and later) stage digital filters at block 700. Specifically, the DSP sets the second filter stage coefficient pointer 674 to point to the (fixed) second stage coefficients 652, and also sets the ORDER and decimation factor (M2) based upon fixed parameters (e.g., M2=2). The DSP then begins the overall data acquisition and filtering loop which it continually executes in the example. It begins this overall loop by initializing synchronization control and error variables (block 702), and then executes loop 602 while FIFO 174 (176) is empty checking for a message input or data input.

If a message 400 arrives from the host compute 50, the DSP processes the message based on the following expected format in this example:

| Field Name | Length (bits) |
|---|---|
| Header/Command Word 402 | 8 |
| # of Filters Field 404 | 8 |
| Filter ID # Field 410(1) | 8 |
| Number of Filter outputs Field 412(1) | 16 |
| . | |
| . | |
| . | |
| Filter ID # Field 410(n) | 8 |
| Number of Filter Outputs Field 412(n) | 16 |
| Message terminator (null) 408 | 8 |

In this example, there are only three bytes per filter specified along with a header and terminator byte, so host configuration of the FIR multi-rate filters is very fast, which is important in order to minimize the time required to initiate patient scanning once a MRI imaging protocol has been selected by the system operator. The DSP saves these filter selections in an array within program memory 182 (186) as shown in FIG. 6A (block 604). Then the DSP checks if Rx_ON is asserted. If it is, the DSP then initializes the pointer list 660 to point to the appropriate database elements 302 based on the filter ID information preselected by the host message 400 (block 704). Otherwise, the DSP continues to loop waiting for a message 400 or Rx_ON asserted.

The DSP next executes a loop 606 that waits for data input and also waits for a command from sequencer 52 ("Sample Gate") defining an active filtering window. In more detail, the DSP checks for input data in the channel FIFO 174 (176) (block 706), and once data arrives, reads the 32-bit data set header from the FIFO (block 708). The DSP then starts signal processing, and waits in a loop (defining by decision block 710) for "Sample Gate" to be asserted while checking the number of data input transfers performed against the maximum allowed. Once Sample Gate occurs, the DSP enables interrupts (block 712) and reads and checks the filter select word 500 specified by sequencer 52 (block 714). The DSP next selects the current filter parameters to use from the subset of filters preselected by host message 400 based on the filter select word 500 specified by MRI sequencer 52 (block 608). The filter select word 500 specified by sequencer 52 is "relational" in the sense that its value has no absolute meaning in terms of a specific filter, but instead merely selects from a changeable filter list specified by the host computer (and which the host computer may change from time to time). For example:

| Binary Value of Filter Select Word From Sequencer | Selects |
|---|---|
| 000 | Filter ID specified in host message field 410(1) |
| 001 | Filter ID specified in host message field 410(2) |
| 010 | Filter ID specified in host message field 410(3) |
| . | . |
| . | . |
| . | . |
| 110 | Filter ID specified in host message field 410(15) |
| 111 | Filter ID specified in host message field 410(16) |

This arrangement has certain advantages, such as, for example, providing additional flexibility in that the same linked sequencer microcode can be used for different filter configurations specified through an independent host process, and the number of bits the sequencer must specify in the form of a filter select word 500 are reduced (in this example, only three bits are used to effect selection from over one hundred different filter configurations, thus conserving sequencer output bit widths that are normally at a premium). To perform this selection process based on the sequencer-specified filter select word 500, the DSP selects the one pointer 660 corresponding to the filter select word 500, and then "looks up" the corresponding ORDER, M1 decimation factor, coefficient buffer location from filter database 300 and also looks up the number of output information from the appropriate stored host field 412 (blocks 716, 718). The DSP then computes the data set length and sets up phase information to provide synchronization (block 720; see U.S. application Ser. No. 08/260,789 for a discussion regarding synchronization).

The DSP in this example sets up all loop parameters beforehand in such a way as to eliminate unnecessary computations of constants from the filtering loops in order to increase speed performance. In this example, the program variables derived from the filter parameters are determined in such a way as to minimize computations of values such as pointers to data and FIR coefficients and filter algorithm parameters inside the actual filtering loops. This is important given the high speed at which the filtering program runs even though it is being executed by a very high performance DSP such as an Analog Devices ADSP21020. Thus, in this example, the DSP sets up constants for the yd[] synchronization and length (i.e., "sync 1", and "$yd_{13}$len" as referenced in application Ser. No. 08/260,789) (block 722), and also sets up constants for a first stage FIR convolution based on the sync point calculations performed at block 722 (block 724). The DSP next sets a pointer to the x[] input data set ring buffer (stored in this example within memory 184), and selects the correct h1[] coefficient ("h—ptr" 678 shown in FIG. 6A) for the first synchronized convolution to be performed by the first FIR filter stage (block 726). The DSP at this time also sets up and precalculates constants for the second stage FIR convolution (block 728), and then begins the first filtering loop 610 in which it will compute the complete sum for each output element in yd[] and partial sums in zd[] until the first FIR stage is full. In this loop, the convolution of x[] with h1 [] and decimation by M1 produces yd[] and the convolution of yd[] with h2[] with decimation M2 produces zd[] (see FIG. 3).

The DSP then executes a first filtering loop, and begins by computing yd[] while h1[] is not full of data. To do this, the DSP sets up data and filter pointers such as coefficient pointer 676 (block 732). The DSP next checks to see if the first $yd_{13}$ sum will be zero, and if so, it skips to the next iteration (block 734). It then sets a convolution loop counter, and uses a "zero overhead loop" (block 614) for convolution of x[] (pointed to by the data pointer set up at block 734) and h[] (pointed to by h_ptr 678).

In this example, "zero overhead loops" are used to increase speed and performance. A "zero overhead loop" is a hardware supported loop capability built into certain high performance digital signal processors such as the ADSP21020. In such "zero overhead loops" there is no instruction executed explicitly at the end of the loop to test whether another iteration of the loop should be performed and to branch conditionally. This hardware support makes it possible to run at full speed without having to avoid looping (thus allowing the number of iterations to be parameterized without suffering in speed performance).

In this example, the "zero overhead loops" are written in assembly language, and an "alternate register file" set is used for the assembly language code so as not to disturb the other program parameters stored in "primary registers" used by the rest of the program (block 738). The pointers to the data and h1 are set (block 740), and then a fast zero overhead loop "inner 1" is then executed in pipeline fashion in order to extract the maximum floating point computational rate from the DSP (block 741). This "zero overhead loop" provides convolution in one instruction (cycle time equals 33 ns in the example) without requiring a second explicit instruction to test for branch conditions. The output of the convolution is saved (block 742), the primary registers are again selected (block 744), and then a few computations are performed to determine the parameters of the second FIR stage inverted convolution. The program then computes the convolution of h2[] with yd[] by determining which points are contributing to each zd[] element and computing the correct product to add to the partial sum of each zd[] element. To do this, the DSP performs another assembly language zero overhead loop (blocks 750, 752, 753, 754, 756) to perform the second FIR stage inverted convolution. The "zero overhead loops" comprising the single instructions "inner 1" (block 741) and "inner2" (block 753) contain the vast majority of all computations performed by the filtering program when the first stage is not full.

Once the DSP has finished executing the converted convolution "inner2" loop 618 for the second filter stage, it updates the convolution variables (block 758), checks the number of data transfers performed, and gets more data from FIFO 174 (176) if there is not enough for the next set of convolutions (block 760). The DSP then determines whether the first filter stage is full (block 762). If it is not yet full, the DSP loops back to block 730 (FIG. 7B) to execute the next iteration of the first filtering loop 610. If the filter has become full, the DSP leaves loop 610 and begins executing loop 612 (which is optimized differently for the full first stage filter).

In this example, loop 612 begins by setting up constants for loops in which the first FIR stage is full. To do this, the DSP sets up data and filter pointers (block 766), and sets the convolution loop counter in preparation for a first stage filtering "zero overhead loop" as described above (block 616). The DSP executes the "zero overhead loop" for the full first-stage FIR filter to perform the h1 convolution (blocks 770, 772, 773, 774, 776) in a manner similar to described above for the "inner1" loop. The DSP then performs the inverted convolution calculations with decimation factor M2=2 for the second FIR filter stage loop 620 (blocks 780, 782, 784, 786, 787, 788, 790, 792, 794 to compute the convolution of h2[] with yd[] by determining which points are contributing to each zd[] element and computing the correct product to add to the partial sum of each zd[] element. The DSP next determines whether a further iteration of the first stage full FIR loop 612 needs to be performed (decision block 796). If so, the DSP returns to block 766 to perform the next iteration.

The DSP then checks whether enough total data has been acquired (block 800). If the requisite number of data inputs x[] have been processed, the DSP stops data transfer from the FIFO 174 (176) (block 800), sets the data input stop bit in a status register (block 802), and loops to output the completed data set in zd[] to the host computer (block 628). Control then returns to the beginning of the overall program (block 702, FIG. 7A) to await the next host message 400 and the next data input set.

As will now be appreciated, the disclosed synchronized digital lowpass filter design for magnetic resonance imaging (MRI) supports multiple frequencies and is highly configurable without sacrificing speed and performance. The first filter stage is selected from a database of filter coefficient sets which can be loaded at start time and used in place. Second and later filter stages are fixed in the example. A large number of different filter frequencies can be selected rapidly without changing the filter program, reducing the amount of time to start up the MRI system, and allowing filter changes in real-time "on-the-fly" between echoes and/or A/D samples. For example, preselection of one or more filters can be performed in less than 100 microseconds by a host processor—and during real-time operation, one of several lowpass filters can be selected "on-the-fly" by the sequencer with a latency of less than 10 microseconds.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. In a magnetic resonance imaging system of the type including a computer and a real time sequencer, a method of processing a NMR signal to generate an image comprising the following steps:
   (a) prestoring a filter database specifying plural digital filter parameter sets corresponding to plural different digital filters;
   (b) receiving a message from the real time sequencer;
   (c) selecting one of said plural different digital filter sets based on said received message;
   (d) generating a magnetic field;
   (e) stimulating nuclear magnetic resonance phenomena with said magnetic field, said phenomena causing a NMR signal to be generated;
   (f) sampling said generated NMR signal to provide a digitized input data set;
   (g) accessing said selected digital filter set from said prestored filter database;
   (h) digitally filtering said digitized input data set based at least in part on said accessed parameters; and
   (i) generating, at least in part using the computer, an image in response to said digitally filtered input data set.

2. A method as in claim 1 wherein said digitally filtering step (h) comprises digitally filtering digitized NMR signals resulting from first and second successive NMR echoes, said step (b) comprises receiving said message from the real-time MRI sequencer between the first and second successive NMR echoes, and said step (g) comprises switching to a different digital filter set in real time between said first and second successive NMR echoes.

3. A method as in claim 1 wherein said step (f) includes the step of producing first and second sequential samples, said step (b) comprises receiving said message from the real-time MRI sequencer between the first and second sequential samples, and said step (g) comprises switching to a different digital filter set between producing said first sample and producing said second sample.

4. A method as in claim 1 wherein said prestoring step (a) comprises prestoring said filter database, including filter coefficients, within the program memory RAM of a digital signal processor, and said accessing step (g) comprises using filter coefficients stored within said RAM for performing step (h) in place without moving or copying the filter coefficients.

5. A method as in claim 1 wherein said prestoring step (a) includes storing said plural sets of filter coefficients, said selecting step (c) includes selecting one of said plural coefficient sets, and said accessing step (g) comprises using said selected stored coefficient set in place without requiring said coefficient set to be copied.

6. A method as in claim 1 wherein said receiving step (b) comprises receiving, from the computer, a list preselecting a subset of said different digital filters, and said selecting step (c) includes selecting, in response to the message received from the sequencer, one of said different digital filters within said subset preselected by said step (b).

7. A method as in claim 6 wherein said selecting step (c) further includes receiving a filter select word from the MRI sequencer specifying said one of said different digital filters within said subset to select.

8. A method as in claim 1 wherein said prestoring step (a) includes prestoring digital signal processor executable code with said filter database.

9. A method as in claim 1 wherein said digitally filtering step (h) includes performing a convolution transformation with at least one zero overhead loop.

10. A method as in claim 1 wherein said digitally filtering step (h) includes performing an inverted convolution transformation with at least one zero overhead loop.

11. In a magnetic resonance imaging system, a method of digitally filtering a digitized NMR signal input data set comprising:
(a) prestoring a digital filter database comprising plural different first-stage FIR digital filter coefficient sets;
(b) receiving at least one digital filter ID;
(c) selecting one of said prestored plural different first-stage FIR digital filter coefficient sets based on said digital filter ID;
(d) in a first-stage digital filter, convoluting said NMR signal input data set with said selected first-stage FIR digital filter coefficient set to provide a convoluted data set; and
(e) in a later-stage digital filter, performing at least one inverted convolution on said convoluted data set using a further set of coefficients without requiring said further set of coefficients to be selected based on said received digital filter ID.

12. A method as in claim 11 wherein said performing step (e) comprises using said further coefficient set with any of said plural different first-stage FIR digital filter coefficient sets.

13. A method as in claim 11 wherein the MRI system includes a computer and a real time sequencer, and wherein:
said receiving step (b) comprises receiving plural filter IDs from the computer, and
said selecting step (c) includes:
(1) receiving a filter select message from the sequencer, and
(2) selecting one of said plural filter IDs received from the computer based on said filter select message received from the sequencer.

14. A method as in claim 11 wherein said selecting step (c) is performed in real time between successive digital sample times of said NMR signal within an open sampling window to switch filter characteristics between successive digital sample times within the open sampling window.

15. A method as in claim 11 wherein said selecting step (c) is performed in real time between successive NMR spin echo responses within an open sampling window to switch filter characteristics between successive digital spin echo responses within the open sampling window.

16. A method as in claim 11 wherein said step (d) includes executing at least one zero overhead loop.

17. A method as in claim 11 wherein said step (d) includes decimating by a decimation factor selected from said filter database based on said received filter ID.

18. A method as in claim 11 wherein said step (e) comprises performing second and third digital filtering operations, said second and third digital filtering operations using the same coefficients and the same decimation factor.

19. A method as in claim 11 wherein said step (d) includes executing parameterized digital filtering program code.

20. A magnetic resonance imaging digital receiver comprising:
analog front end section coupled to receive a NMR signal, said front end section including at least one mixer and associated intermediate frequency stage having an anti-aliasing filter;
an analog to digital converter having an analog input connection coupled to said front end section and having a digital output, said analog to digital converter periodically sampling said analog input connection;
a quadrature detector coupled to said analog to digital converter digital output, said quadrature detector having I mid Q channel outputs;
a first digital signal processor coupled to said quadrature detector I channel output; and
a second digital signal processor coupled to said quadrature detector Q channel output,
wherein said first and second digital signal processors each include a memory that stores a digital filtering program and also stores a filter database including multiple filter parameters, and wherein said first and second digital signal processors each include means coupled to said program memory for selecting from said multiple filter parameters in response to a message received between successive periodic samples by said analog to digital converter during an open image acquisition sampling window.

21. A MRI digital filtering database for controlling filtering of a NMR signal within a plural stage multi-rate FIR digital filter, said database comprising:
plural selectable entries corresponding to plural different first MRI digital filter stage configuration, said plural entries each specifying a decimation factor and a convolution coefficient set; and
an entry corresponding to a later MRI digital filter stage, said later stage for use with each/any of said plural different first MRI digital filter stages.

22. A method of operating a MRI system including a computer, a sequencer, and a digital receiver having at least one MRI digital filtering digital signal processor, the method comprising:
(A) loading a parameterized digital filtering program together with a filter database into the memory of the MRI digital filtering digital signal processor;
(B) subsequent to said step (A), starting execution of said filtering program;
(C) subsequent to said step (B), sending, from the computer to said digital receiver, a message specifying plural digital filters;
(D) generating, with a sequencer, an output selecting one of said plural digital filters specified by said message, and sending the output from the sequencer to the digital receiver;
(E) selecting, with the digital receiver, filtering parameters from said filtering database corresponding to said one digital filter specified by said sequencer output;

(F) supplying said selected filtering parameters to said parameterized digital filtering program; and (G) filtering a digitized NMR signal with said digital filtering program using said selected filtering parameters.

23. A method as in claim 22 wherein step (D) is performed between receipt of at least one of:

successive NMR echoes, and successive input data samples.

24. A magnetic resonance imaging system comprising:

means for generating a magnetic field stimulating nuclear magnetic resonance phenomena and causing a NMR signal to be generated;

means for sampling said generated NMR signal to provide a digitized input data set at least in part in response to a sampling control signal;

a multi-rate digital filter with integral decimation connected to receive said input data set, said filter having a first, variable linear FIR digital filter stage and at least one subsequent fixed linear FIR digital filter stage, said filter comprising:

a memory that prestores a filter database specifying plural digital filter parameter sets corresponding to plural different digital filters, messaging means for receiving a message, selecting means coupled to said messaging means and to said memory means for selecting one of said plural different digital filter parameter sets based on said received message and for accessing said selected filter parameter set from said prestored filter database, the selecting means using prestored digital filter parameter sets in place without copying them to other memory location(s); and processing means coupled to said selecting means and connected to receive the MRI sequencer sampling control signal, for digitally filtering said digitized input data set based on said accessed parameters to provide data outputs, said processing means including synchronizing means for synchronizing the digitized input data so that data outputs are precisely synchronous with the sampling control signal; and imaging means coupled to said digital filter for generating an image in response to said digitally filtered input data set.

25. Within an nuclear magnetic resonance imaging system of the type including a computer, a sequencer and a digital receiver including an input data sampler controlled by a sampling control signal and a memory having plural sets of filter parameters prestored therein, a method of digitally filtering an MRI signal comprising:

(a) varying the parameters of a first-stage linear FIR digital filter at the time of the start of data acquisition in response to a filter D from the sequencer, including the step of using a selected one of said plural filter parameter sets in place within the memory without copying them for a specific filtering operation;

(b) filtering the sampled input data by using the first stage linear FIR digital filter, integral decimation and at least one subsequent linear FIR digital filter having fixed parameters not affected by the filter D; and (c) synchronizing the input data to provide filtered data outputs that are precisely synchronous with the sampling control signal.

26. A nuclear magnetic resonance imaging system comprising:

a computer, a sequencer, and a digital receiver coupled to the computer and the sequencer, the digital receiver including:

an input data sampler controlled by a sampling control signal, a memory having plural sets of filter parameters prestored therein, and a multi-rate linear FIR digital filter coupled to the sampler and the memory, the digital filter including:

a first-stage linear FIR digital filter that varies its coefficients at the time of the start of data acquisition in response to a filter ID from the sequencer and uses a selected one of said plural filter parameter sets stored in the memory, in place without moving them for a specific filtering operation;

at least one subsequent linear FIR digital filter having fixed parameters not affected by the filter ID, and a synchronization element that synchronizes the input data to provide filtered data outputs that are precisely synchronous with the sampling control signal.

* * * * *